(12) United States Patent
Yatskar et al.

(10) Patent No.: US 6,650,668 B2
(45) Date of Patent: Nov. 18, 2003

(54) CYLINDRICAL TWO-DIMENSIONAL DIODE-LASER ARRAYS AND METHOD FOR MAKING SAME

(75) Inventors: Alexander A. Yatskar, Cupertino, CA (US); Serrena Marie Carter, Fremont, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 156 days.

(21) Appl. No.: 09/969,338

(22) Filed: Oct. 2, 2001

(65) Prior Publication Data

US 2003/0063639 A1 Apr. 3, 2003

(51) Int. Cl.⁷ ............................................. H01S 5/024
(52) U.S. Cl. ......................... 372/36; 372/35; 372/75
(58) Field of Search ............................ 372/36, 35, 75

(56) References Cited

U.S. PATENT DOCUMENTS

| | | | |
|---|---|---|---|
| 3,683,296 A | 8/1972 | Scalise | 331/94.5 |
| 5,029,335 A | 7/1991 | Fisher et al. | 372/36 |
| 5,128,951 A | 7/1992 | Karpinski | 372/50 |
| 5,216,688 A | 6/1993 | Kortz et al. | 372/75 |
| 5,521,936 A | 5/1996 | Irwin | 372/75 |
| 5,627,850 A | 5/1997 | Irwin et al. | 372/43 |
| 5,678,924 A | 10/1997 | Naquin et al. | 374/32 |
| 6,400,740 B1 * | 6/2002 | Karpinski | 372/36 |

OTHER PUBLICATIONS 7 printed website pages, obtained from Laser Diode Array, Inc.'s website, printed Sep. 25, 2001.

* cited by examiner

*Primary Examiner*—James Davie
(74) *Attorney, Agent, or Firm*—Stallman & Pollock LLP

(57) ABSTRACT

A cylindrical two-dimensional diode-laser assembly includes fractionally-cylindrical dielectric segments bonded in a circular aperture in a metal heat-sink. Diode laser bars are located in gaps between the segments with light from the diode-lasers directed inwardly. The segments are made by cutting slots in one end of a tube of the dielectric material with the width of the slots corresponding to the width of the gaps and the part of the tube between slots providing the segments. The slotted tube is metallized and the slotted end of the tube is inserted into the heat-sink aperture with an unslotted part of the tube outside the aperture. The slotted part of the tube is bonded in the aperture and the unslotted part of the tube separated from the slotted part leaving the segments bonded in the aperture.

16 Claims, 8 Drawing Sheets

FIG. 10
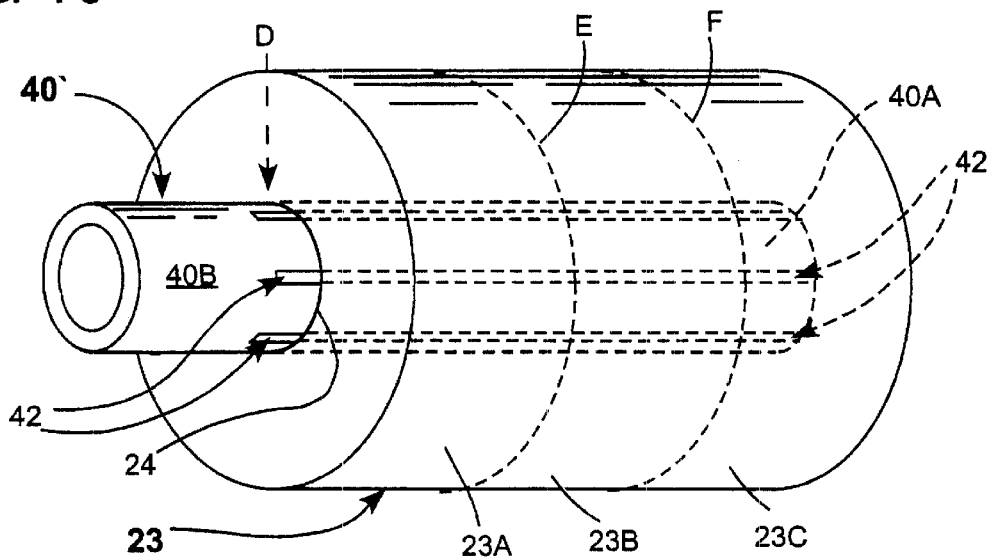
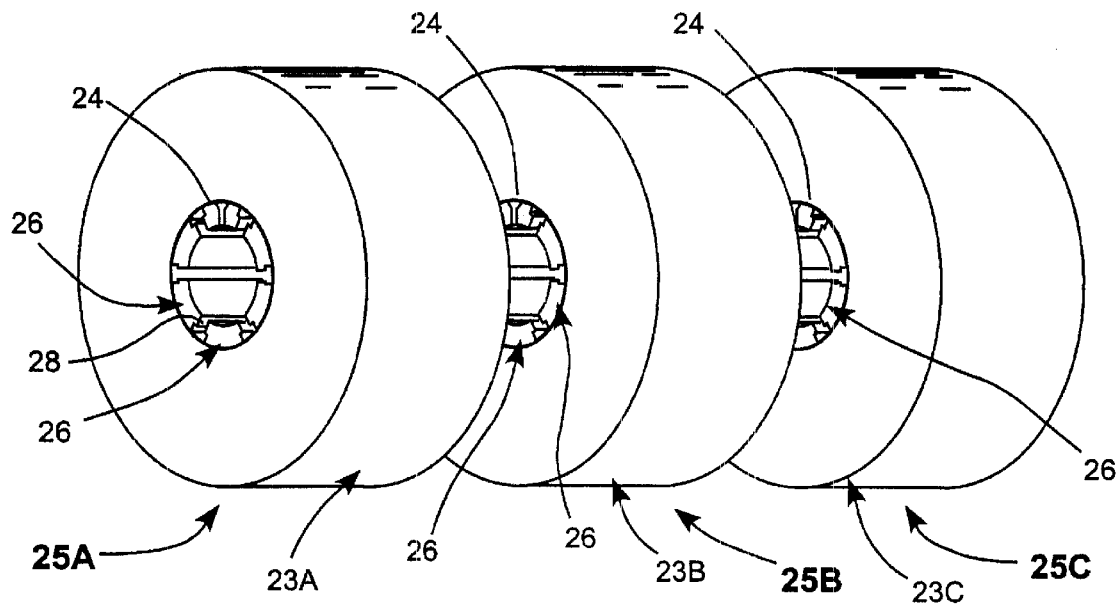
FIG. 11

CYLINDRICAL TWO-DIMENSIONAL DIODE-LASER ARRAYS AND METHOD FOR MAKING SAME

TECHNICAL FIELD OF THE INVENTION

The present invention relates in general to two-dimensional diode-laser arrays. The invention relates in particular to two-dimensional diode-laser array that is cylindrical in one dimension with the diode-lasers arranged such that light therefrom is directed radially inward and can be used, for example, for optically pumping a rod of a laser gain-medium concentrically located within the cylindrical array.

DISCUSSION OF BACKGROUND ART

Several different arrangements for optically pumping a rod of a solid-state laser gain-medium such as neodymium-doped YAG (Nd:YAG) using an array of diode-lasers disposed radially around the rod has been proposed over the past two decades. In each arrangement, an important aspect is that by radially arranging lasers around the rod, optical pump energy can be symmetrically delivered to and absorbed in the rod. Preferably, in any radial position there is also a plurality of lasers extending along the rod such that the rod is also energized evenly along its length. Such an arrangement of diode-lasers may be defined as a two-dimensional array of diode-lasers "wrapped" around the rod, or a "cylindrical" two-dimensional diode-laser array. This type of cylindrical two-dimensional array is often referred to by practitioners of the art as a "doughnut array". The diode-lasers are typically arranged as close to the laser rod as possible, given constraints such as cooling arrangements for the rod itself. While each of the prior-art such arrangements share this same important aspect, they differ widely in the manner in which the diode lasers are assembled in the array, the manner in which they are electrically connected, and the manner in which they are cooled.

One-dimensional diode-laser arrays (longitudinal arrays) are typically formed in a common substrate having a length of about one centimeter (1 cm), a width of about one millimeter (1 mm) and a height of about one hundred micrometers (100 µm). This type of array is referred to by practitioners of the art as a diode-laser bar. One such bar may contain as many as sixty individual diode-lasers (emitters). Diode-laser bars capable of delivering twenty-five watts (25 W) or more of laser light are now commercially available at cost comparable with that of a domestic light fixture. Six such bars arranged every sixty degrees of azimuth to form a cylindrical two-dimensional diode laser array around a laser rod could deliver 150 W or more of laser light to the rod. A significant problem with such a powerful array, however, is that about 150 W or more of heat would be generated in a relatively small volume, close to the rod being pumped. Accordingly, in configuring a mechanical assembly for such an array, cooling arrangements are important.

One mechanical assembly that is suitable for cooling such a high power cylindrical diode-laser laser array is disclosed in U.S. Pat. No. 5,521,936. In this assembly, a plurality of copper segments is arranged around a transparent coolant flow tube in which a laser rod to be pumped is located. Diode-laser bars are located between the copper segments. Current for powering the diode-laser bars is passed in series through the segments and the diode laser bars. Another mechanical assembly that is suitable for cooling such a high power cylindrical diode-laser laser array is disclosed in U.S. Pat. No. 5,627,850. In this arrangement, laser diode bars are located in slots cut in copper segments directly bonded to a dielectric block. The copper segments form a conductor ring around the dielectric block. In one embodiment, a coolant flow tube within the conductor ring forms an annular coolant-channel around a laser rod to be pumped.

While the above-discussed assemblies provide adequate cooling for a high power cylindrical diode-laser array, components of the assemblies appear to be somewhat complex, and assembly of the components appears to be intricate. This could lead to the cost of the mechanical support and cooling of the array being greater than the cost of the diode-lasers themselves. There is clearly a need to reduce the cost of such support and cooling assemblies.

SUMMARY OF THE INVENTION

The present invention is directed to a convenient method for assembling a cylindrical, two-dimensional array of laser diodes. In one aspect of the invention, the diode-laser array comprises a heat-sink having a circular aperture extending therethrough and defining a cylindrical inner wall of the heat-sink. A plurality of fractionally-cylindrical segments of a dielectric material are bonded to the inner wall of the heat-sink. Each of the segments has a metal layer on an inward-facing surface and longitudinal edges thereof. The longitudinal edges of the adjacent segments face each other and are spaced apart defining a gap between the segments. A plurality of longitudinally spaced-apart diode-lasers is disposed in each of the gaps, thereby forming the cylindrical two-dimensional array.

In another aspect of the present invention, a method of assembling a diode-laser array comprises providing a metal heat-sink having a circular aperture extending therethrough and defining a cylindrical inner wall of the heat-sink. A cylindrical tube of a dielectric material is provided. The tube has length greater than the length of the heat-sink aperture. A plurality of longitudinal slots is cut through a first portion of the tube wall. Each of the first longitudinal slots has a length about equal to or greater than the length of the aperture but shorter than the length of the tube. The slots divide the first portion of the tube wall into a plurality of fractionally-cylindrical segments of the dielectric material, and leave a second portion of the tube substantially intact and attached to the plurality of fractionally cylindrical segments. Each of the segments has an inner surface, an outer surface and longitudinal edges. The longitudinal edges of adjacent ones of the segments face each other and are spaced apart defining a gap therebetween. The inner surface, outer surface, and longitudinal edges of each of the segments are metallized. The metallized segments are inserted into the circular aperture of the heat-sink with the intact portion of the tube still attached to the segments and outside of the circular aperture. The metallized segments are bonded to the inner wall of the heat-sink. Following the bonding, the undivided portion of the tube is separated from the bonded segments.

The pluralities of diode-lasers are located in the gaps between segments. Preferably, each plurality of laser diodes is a one-dimensional array thereof formed on a common substrate, i.e., is in the form of a diode-laser bar.

Preferably the heat-sink is made of a metal having high thermal conductivity such as copper, aluminum, molybdenum or alloys having any of these metals as a majority constituent. The dielectric material also preferably has a high thermal conductivity. Suitable dielectric materials include beryllium oxide, aluminum oxide, and aluminum nitride.

Use of the diode-laser array of the present invention is not limited to optically pumping solid-state laser rods. Other uses include but are not limited to heat treating, melting or softening of materials in tube or rod form and welding of plastic tubing.

A particular advantage of the present invention is that there is no requirement to individually manufacture and assemble the dielectric segments. The dielectric tube can be slotted according to the number of segments required while still leaving an intact end of the tube holding the segments precisely in their required alignment while they are being bonded in the heat-sink. It is believed that this can significantly reduce the cost of manufacturing the inventive diode laser array assembly compared with prior art assemblies.

In another aspect of the present invention a cylindrical diode-laser array includes an air-cooled heat-sink unit. The air-cooled heat-sink-unit includes a cylindrical portion having an aperture extending longitudinally therethrough. The cylindrical portion of the heat-sink unit has a plurality of longitudinally-oriented fins extending radially outward therefrom. A plurality of diode-laser bars is located in the aperture and arranged to form a cylindrical two-dimensional diode-laser array cooled by the air-cooled heat-sink unit. In a preferred embodiment of the heat sink unit, the fins are surrounded by a sleeve, and a fan is arranged to move air through the sleeve and over the fins.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIG. 10 schematically illustrates one stage in making a plurality of cylindrical two-dimensional diode-laser arrays in accordance with the present inventions from one metal cylinder and one partially slotted dielectric tube.

FIG. 11 schematically illustrates a plurality of mounting units for cylindrical two-dimensional diode-laser arrays in accordance with the present inventions cut from the metal cylinder and partially slotted dielectric tube of FIG. 10.

DETAILED DESCRIPTION OF THE INVENTION

Figure 1:
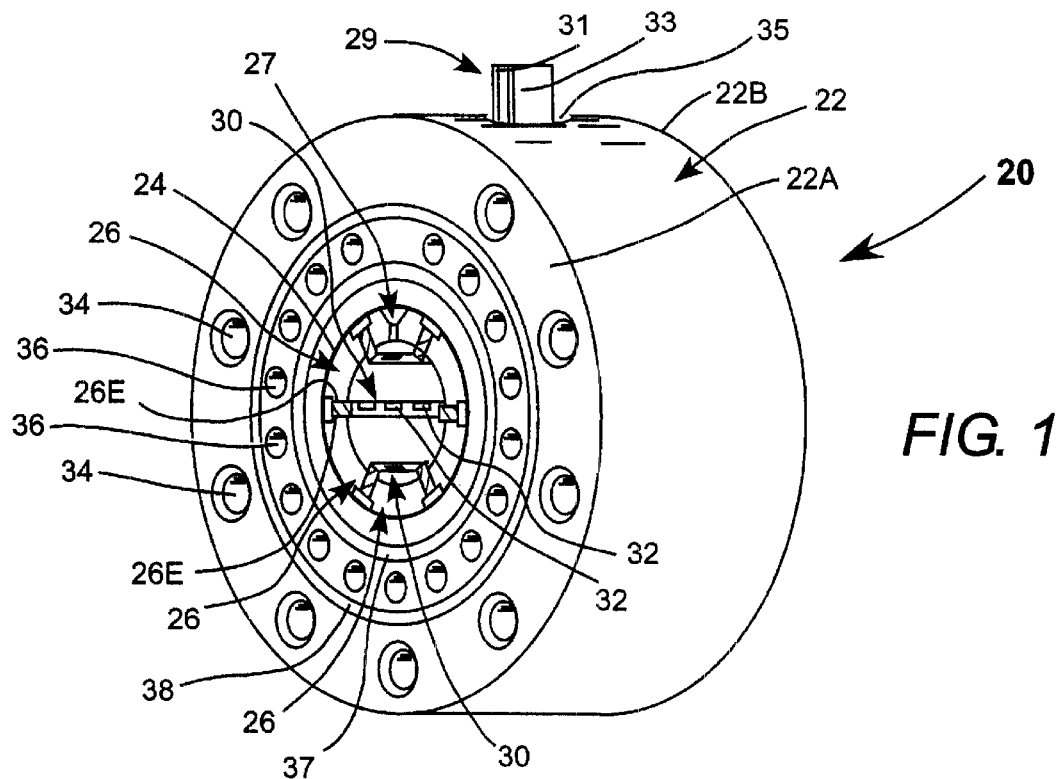
FIG. 1 schematically illustrates one preferred embodiment of a cylindrical two-dimensional diode-laser array in accordance with the present invention, including a metal heat-sink having a circular aperture therethrough defining an inner wall of the heat-sink, a plurality of fractionally cylindrical segments of a dielectric material bonded to the inner wall with longitudinal edges of adjacent segments facing each other and spaced apart defining a gap therebetween, and a plurality of diode-lasers disposed longitudinally spaced-apart in each of the gaps.
Figure 4:
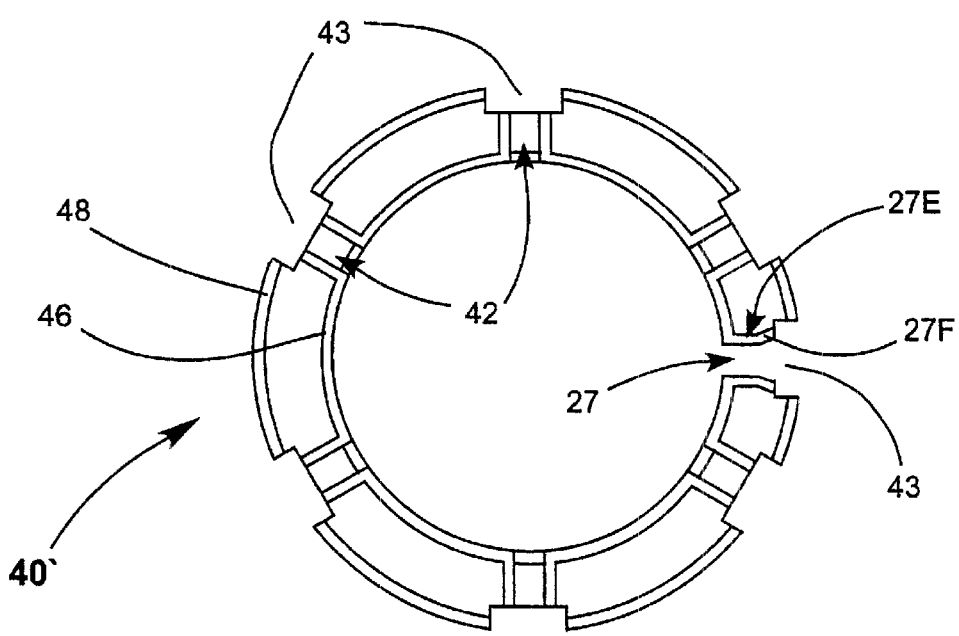
FIG. 4 is an end-elevation view of the slotted part of the dielectric tube of FIG. 2 schematically illustrating yet another stage in forming the dielectric segments of FIG. 1 by widening the slots of FIG. 3 to break any electrical continuity between the first and second layers.
Figure 6:
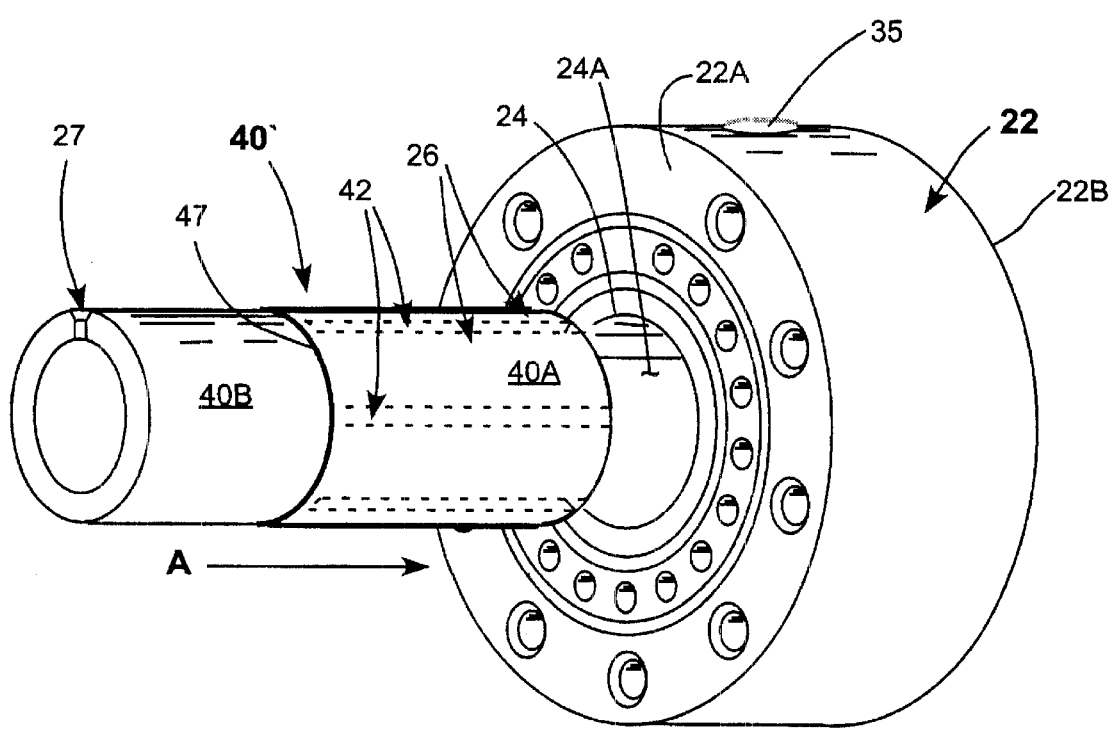
FIG. 6 schematically illustrates still another stage in forming the dielectric segments of FIG. 1 by inserting the foil-wrapped, divided part of the metallized, partially-slotted tube in the heat-sink aperture of FIG. 1.

Turning now to the drawings, wherein like features are designated by like reference numerals, FIG. 1 schematically illustrates one preferred embodiment 20 of a cylindrical diode-laser array assembly or module in accordance with the present invention. Reference is also made to FIGS. 4 and 6 to illustrate certain details. Module 20 includes a cylindrical heat-sink or cooling member 22 having opposite ends 22A and 22B. Heat-sink 22 is preferably made from copper, but may be made from another metal having a high thermal conductivity such as aluminum, or molybdenum. Heat-sink 22 has a circular aperture 24 extending completely therethrough and defining a cylindrical wall 24A of the aperture (see also FIG. 6). Wall 24A may be alternatively defined as an inner (cylindrical) wall of heat-sink 22. While the cylindrical form of heat-sink 22 is preferred, the heat-sink may have other outer forms, such as polygonal, may be used without departing from the spirit and scope of the present invention. It is important however that aperture 24 is circular.

A plurality (here, six) of fractionally-cylindrical or partially-cylindrical segments 26 of a dielectric (ceramic) material is bonded to wall 24. Longitudinal edges 26E of segments 26 are spaced apart and parallel to each other defining a gap 28 therebetween (see FIG. 6). A diode-laser bar 30 including a plurality of diode-lasers 32 is located in each gap 28. Light from the diode-lasers is inwardly directed. Dielectric segments 26 are preferably made of a dielectric material having a high thermal conductivity. Beryllia and alumina are preferred such materials, with beryllia being preferred.

One of segments 26, indicated in FIG. 1 as segment 26A, includes a longitudinal slot 27. One purpose of slot 27 is to provide an arrangement for making electrical contact with diode laser bars 30. Slot 27 is engaged by a contact bar 29 having electrical contacts 31 and 31 on opposite sides thereof. Contact bar 29 extends through an aperture 35 in heat-sink 32 to engage the slot. This contact arrangement is described in detail further hereinbelow.

Heat-sink 22 (module 20) preferably has a thickness of about 1 centimeter (cm). This is a standard length for commercially available diode-laser bars. Holes 34 extending through heat-sink 22 allow two or more modules 20 to be bolted together to form a longer assembly. This may be required, for example to optically pump a solid-state gain rod having a length of 2 cm of more. Through-holes 36 provide channels for water-cooling heat-sink 22. End caps (not shown) provide water and electrical connections to the module, or to end ones of a bolted-together assembly of the modules. Grooves 37 and 38 are provided to accommodate O-ring seals or the like (not shown) for preventing water leakage from bolted-together modules or from end caps bolted to the modules.

Figure 2:
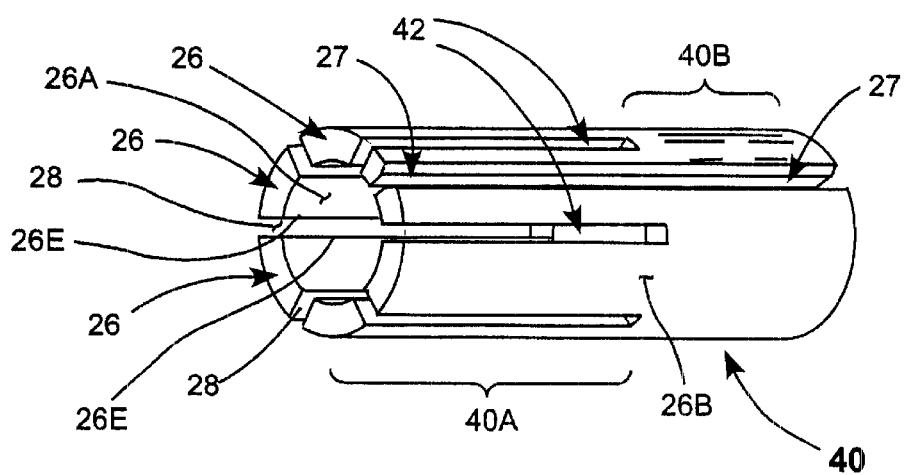
FIG. 2 schematically illustrates one stage in forming the dielectric segments of FIG. 1 by slotting one part a tube of the dielectric material to divide that part of the tube into a plurality of partially cylindrical segments, leaving another part of the tube holding the segments together as a group.

Referring now to FIG. 2, in a preferred method of forming dielectric segments 26, longitudinal, preferably parallel-sided, slots 42 are cut in a tube 40 of the dielectric material. Slots 42 divide a portion 40A of tube 40 into segments 26. Above-described slot 27 is cut through the entire length of tube 40. A portion 40B of tube 40, while including a slot 27 is otherwise intact and is able to retain segments 26 together, as a group. As used in the claims, intact or substantially intact is intended to mean that the portion 40B can act as a jig to support the multiple segments 26. As can be seen, portion 40B does include one slot 27 and could include other cut-outs as long as portion 40B can support the segments.

Tube 40 has a outside diameter (OD) selected such that, when coated with a metal layer (discussed further hereinbelow) for facilitating bonding of segments 26, the tube has a close fit in aperture 24 of heat-sink 22. The width of slots 42 is selected to correspond to the width of gap 28 between the segments when they are bonded in aperture 24 and is determined by the height of the diode-laser bars to be located therein. The length of the slots is made at least as long as aperture 24 is long, i.e., at least as long as heat-sink 24 is thick, and preferably one or two millimeters longer. As noted the tube is slotted by slots 42, the slotted or divided portion 40A of tube 40 becomes essentially segments 26, possibly slightly longer than their finished length, attached to undivided portion 40B of the tube. Edges 26E of the segments are in what will be their relationship to each other when bonded in aperture 24 of heat-sink 22.

Figure 3:
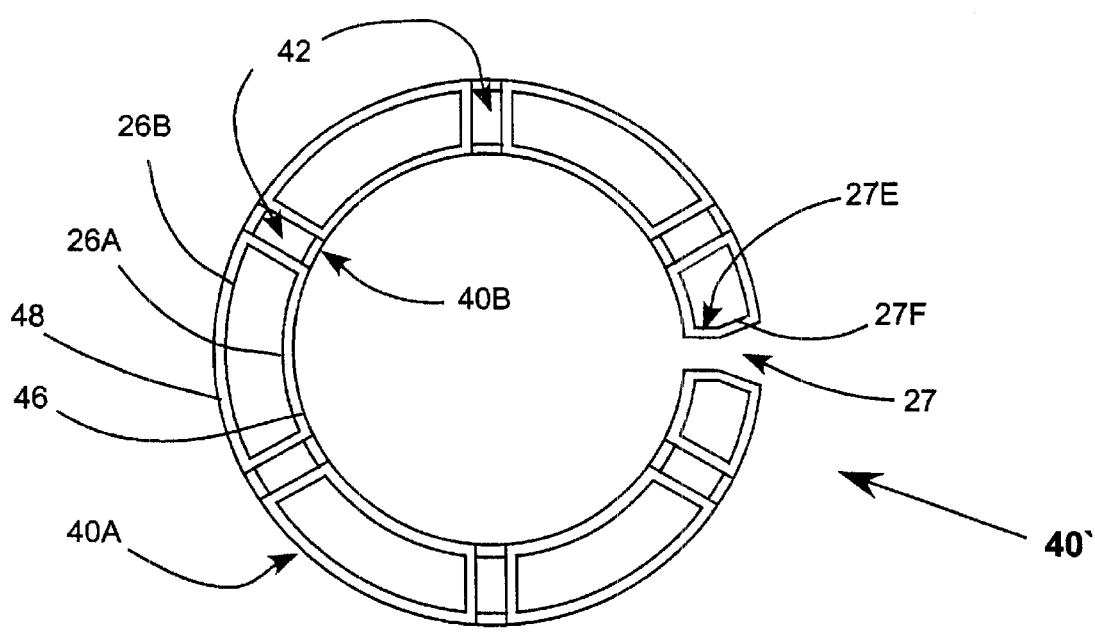
FIG. 3 is an end-elevation view of the slotted part of the dielectric tube of FIG. 2 schematically illustrating another stage in forming the dielectric segments of FIG. 1 by providing a first metal layer on the partially slotted tube to provide electrical-contact surfaces for the diode lasers of FIG. 1 and to provide a second metal layer to facilitate bonding the segments to the heat-sink.

Referring now to FIG. 3, after tube 40 has been slotted, a metal layer 46 is deposited on inner (inward facing) surfaces 26A of segments 26. Another metal layer 48 is deposited on outer surfaces 26B of segments 26. The metal layers extend into slots 42 to cover edges 26E of the segments. The metal layers also extend into slot 27 to partially cover edges 27E of the slot. Depending on the method of depositing the metal layers, the layers may also extend onto undivided portion 40B of tube 40, as indicated in FIG. 3, but this is not a requirement of the method. The metal layers preferably have a thickness of about 0.001 inches and are preferably layers of a tungsten-nickel-gold (W—Ni—Au) alloy or a tungsten-nickel-silver (W—Ni—Ag) alloy. In these alloys, tungsten provides adhesion to the dielectric (ceramic) material and nickel provides a path for high current. Silver and gold provide corrosion resistance and enhance solderability.

Depositing metal layers such as layer 46 and 48 on a dielectric tube or substrate is often referred to by practitioners of the art as metallizing the tube or substrate. The metallized tube is designated by the reference numeral 40' in FIGS. 3–9 and hereinafter.

Outer metal layer 48 is provided to facilitate bonding of segments 26 to wall 24A of aperture 24. Inner metal layer 46 provides electrical contact between the diode-laser bars (not shown in FIG. 3) that are to be located in gaps 28 between segments 26. Accordingly, it is necessary to break electrical continuity between layers 46 and 48 to avoid a short circuit. One preferred method of providing this break in electrical continuity between layer 46 and 48 is illustrated schematically in FIG. 4. Here, a portion of slots 42 and 27 is widened by cutting grooves 43 in tube 40, over each of slots 42, and over slot 27. Cutting grooves 43 as depicted in FIG. 4 breaks the electrical continuity between metal layers 46 and 48 while still leaving some metallization on edges of segments 26 and slot 27 for making electrical contact with diode-laser bars 30. In this regard, it is important that some metallization remain on flared portion 27F of edges 27E of slot 27.

It should be noted here, that in FIGS. 1–4 discussed above, and in FIGS. 5–9 discussed below, slots 42 and 27 are shown, for ease of illustration, as having about the same width. In practice slots 24 and slot 27 can have different widths. By way of example, a preferred width for slots 42 is about 0.008 inches and a preferred width for slot 27 is about 0.050 inches at the widest portion thereof. The width of grooves 43 is preferably selected to extend the width of slots 40 by about 0.002 inches. Grooves 43 preferably have a depth of about 0.005 inches.

Assembly of segments 26 into heat-sink 22 is next described with reference to FIGS. 5–9. In FIGS. 6–9, metal layers 46 and 48 are not expressly illustrated because of the scale of the illustrations.

Figure 5:
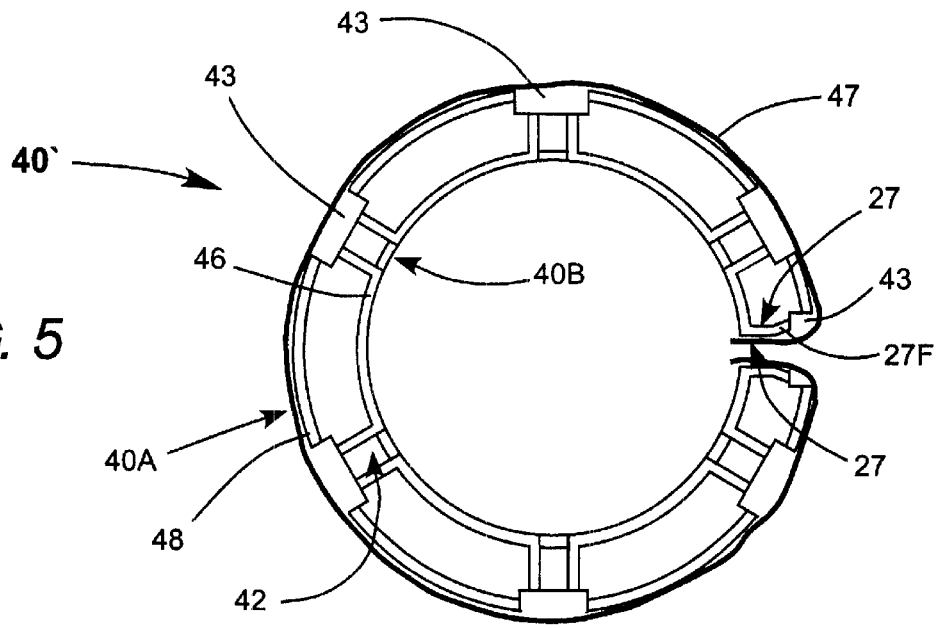
FIG. 5 is an end elevation view schematically illustrating wrapping the partially slotted tube of FIG. 5 with a Au—Ge foil bonding medium.

Referring first to FIG. 5, divided portion 40A of tube 40 is wrapped with a foil sheet 47 of a suitable solder material. A silver-germanium (Ag—Ge) alloy solder is preferred for soldering to a heat sink of copper or a copper-based alloy. Sheet 47 preferably has a thickness of about 0.001 inches, and is preferably wrapped tightly around the tube and held in place with an adhesive. Ends of sheet 47 are preferably tucked into slot 27 as indicated in FIG. 5.

Referring to FIG. 6, foil-wrapped, slotted part 40A of metallized tube 40' is inserted into aperture 24 of heat-sink 22 at end 22A thereof as indicated in FIG. 6 by Arrow A. Slot 27 must be aligned with aperture 35 (see FIG. 1) of heat-sink 22. If, as is preferable, slots 42 are made longer than heat-sink 22 is thick, some portion of the slots will protrude from one side of heat-sink when the slotted end of the tube is flush with end 22A of the heat-sink (see FIG. 7). Slot 27 provides a degree of diametrical compressibility to tube 40'. This can be of assistance inserting the foil-wrapped tube into aperture 24 of heat-sink 22.

Slot 27 can also be used to facilitate alignment of tube 40' in aperture 24 in conjunction with a suitable alignment fixture. One such alignment fixture (not shown) is a disc having an aperture therein corresponding to aperture 24. An alignment key in the aperture is shaped to slide in slot 27 of tube 40'. Pins are provided on the disc for engaging cooling-fluid holes 36. The alignment fixture is used as a guide for sliding tube 40' into aperture 24 in a correct alignment.

With metallized tube 40' held in this position, segments 26 are bonded to wall 24A of aperture 24 by heating the assembly to a temperature of 500° C. to cause solder sheet 47 to melt and flow, then allowing the assembly to cool to solidify the solder and bond the segments to the heat-sink. The "tucked-in" solder material wicks away during bonding thereby avoiding an electrical short between layers 46 and 48. It should be noted, here, that if a bonding medium other than Ag—Ge foil is used, some temperature other than 500° C. may be required to cause the bonding medium to melt.

The bonding process can be assisted by inserting a tightly fitting aluminum rod (not shown) into tube 40'. The aluminum rod having a higher coefficient of expansion than the ceramic material of tube 40', when the assembly is heated, the aluminum rod will force segments 26 against the wall of aperture 24 of the heat-sink to optimize the bond. Slot 27 imparts sufficient elasticity to tube 40' that the differential expansion of the aluminum rod can be accommodated.

If heat sink 22 is made from aluminum or an aluminum-based alloy, it may be found preferable to omit solder sheet 47 and bond tube 40' to wall 24A of aperture 24 by diffusion bonding. In this case metalization layer 48 preferably is a two layer composite layer with an inner component of an alloy as described above and an outer component of gold. Diffusion bonding takes place between the gold component of layer 48 and wall 24A of aperture 24. Optionally tube 40' may be wrapped with a sheet 47, in this instance, of titanium foil. This may be found to promote diffusion bonding.

Figure 7:
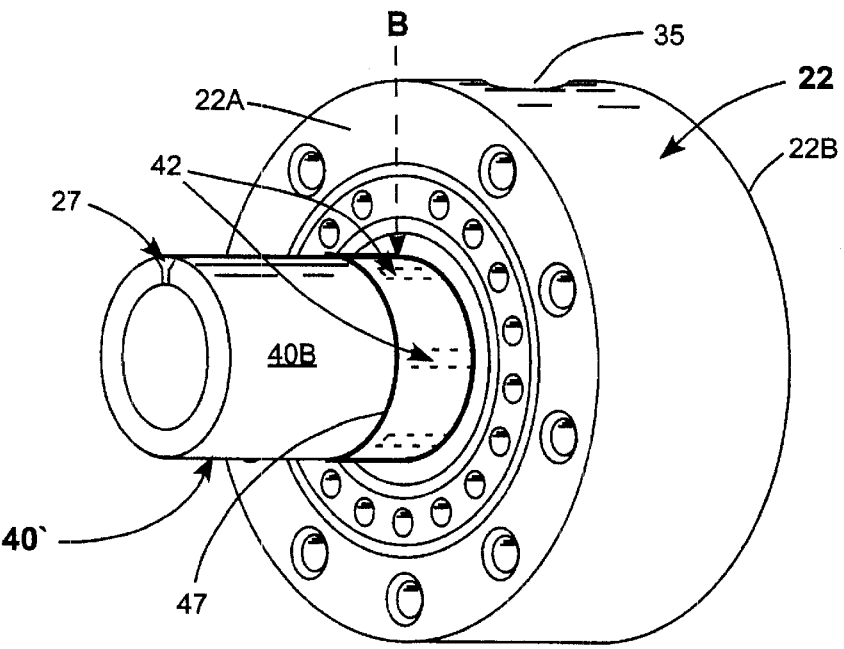
FIG. 7 schematically illustrates still another stage in forming the dielectric segments of FIG. 1 with the divided part of the metallized, partially-slotted tube in the heat-sink aperture of FIG. 1 and the undivided part of the tube, still attached to the divided part of the tube, outside of the heat-sink aperture.
Figure 8:
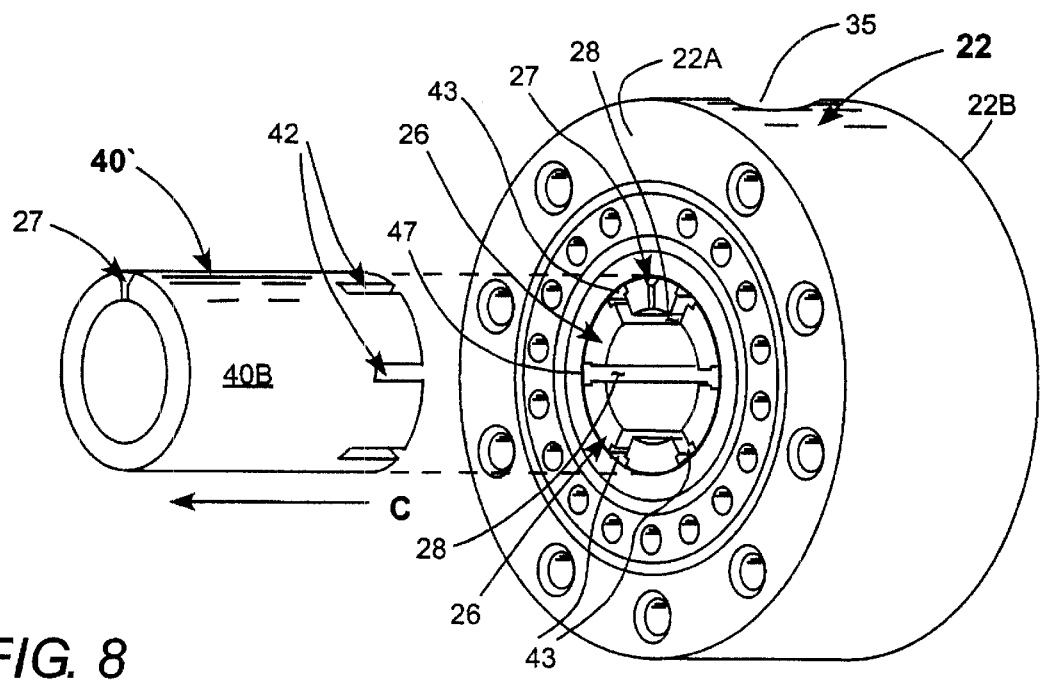
FIG. 8 schematically illustrates a further stage in forming the dielectric segments of FIG. 1, with the undivided part of the metallized tube having been separated from the divided part of the metallized tube to leave the divided part of the tube providing the dielectric segments bonded in the heat-sink aperture.

When bonding of segments 26 is complete, metallized tube 40' is preferably cut and polished flush with end 22A of heat-sink 22 as indicated in FIG. 7 by arrow B. Referring to FIG. 8, undivided portion 40B of the tube (with remnants of slots 42) can then be separated from the slotted portion of the tube (indicated in FIG. 8 by Arrow C) leaving segments 26 bonded in the heat-sink. Diode-laser bars 30 (not shown in FIG. 8) may then be inserted and soldered into in gaps 28 between segments 26 to complete the array 20 of FIG. 1. Before inserting and soldering the diode-laser bars between segments 26 it is preferable to insert a thin ceramic platelet (not shown in FIG. 8) into each of grooves 43 to prevent the diode-laser bars from contacting heat-sink 22. Soldering is preferably carried out by applying flux to the diode-laser bar and the touching each side of the bar with molten solder. Capillary action in space between the diode-laser bar and segments 26 will draw the molten solder between the bar and the edges of the segments. Once the solder has solidified, the ceramic platelets can be removed.

Figure 9:
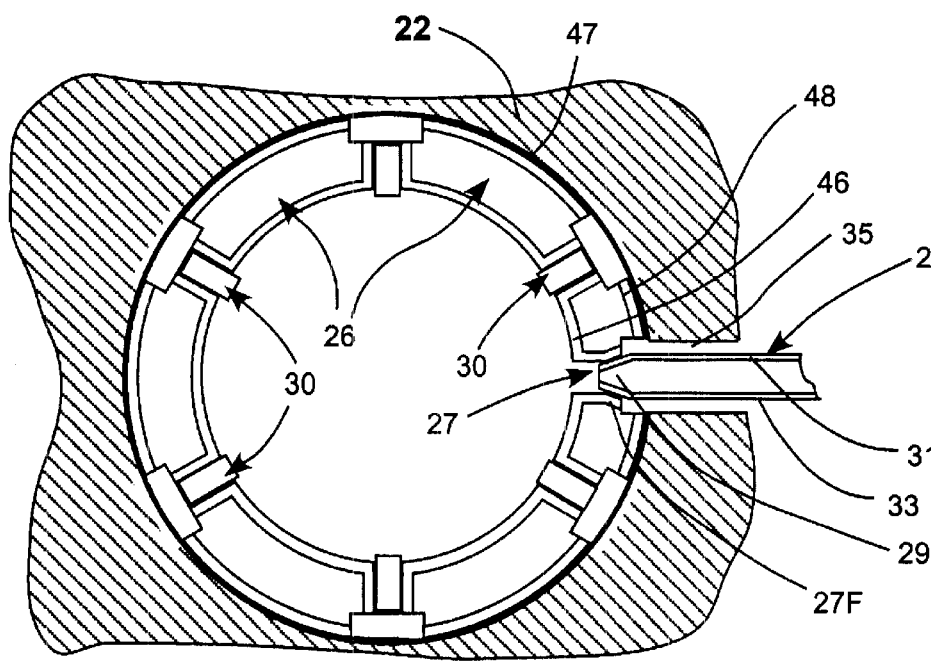
FIG. 9 is an end elevation view, partially in cross-section, schematically illustrating an arrangement for making electrical contact from outside the heat-sink of FIG. 1 with the diode-laser bars.

Referring now to FIG. 9, one preferred method of making electrical connection with diode-laser bars 30 via contact bar 29 of FIG. 1 is illustrated. Here a portion of heat-sink 22 surrounding segments 26 and aperture 35 extending through the heat-sink are illustrated in cross-section. Contact bar 29 has an end portion 29T thereof tapered to correspond with flared portion 27F of slot 27. Contact surfaces 31 and 33 of contact bar 29, on tapered portion 29T thereof are soldered to layer 46 extending into slot 27 to make electrical contact with layer 46. After soldering the contact bar to layer 46, the portion of aperture 35 not occupied by the contact bar is filled with an epoxy (not shown) to prevent the contact bar from making accidental electrical contact with heat-sink 22.

With contact bar 29 connected to layer 46 in this manner, the positive and negative poles (not shown) of a power supply (not shown) can be connected to layer 46 and diode-laser bars 30 will be connected in series with the power supply.

In another preferred method, contact bar 29 may be held in slot 27 while bonding of segments 26 is carried out. In this way soldering of the contact bar will take place as segments 26 are soldered to wall 24A of aperture 24. If a suitable inwardly-directed force is applied to contact bar 29, wedge-shaped tip 29T of the contact bar bearing on surfaces 27F of slot 27 can be used to force segments 26 against wall 24A of aperture 24 during the bonding process. If high bonding temperatures are used, for example, higher than 500° C., this method of forcing segments 26 against wall 24A may be found preferable to using an aluminum rod as described above.

One variation of the above-described method of forming segments 26 is described below with reference to FIG. 10 and FIG. 11. Here, metallized, slotted, dielectric tube 40' includes slots 42 having a length more than three times greater than a desired length of finished segments 26. Tube 40 has slotted part 40A thereof inserted into a circular aperture or bore 24 extending through a metal cylinder 23 having a length slightly less than the length of slots 42. Intact part 40B of the tube is outside of aperture 24. The length of cylinder 23 is sufficient that it may be cut transversely along dotted lines E and F to form three small cylinders 23A, 23B, and 23C, each having the desired length of the finished segments 26.

Slotted part 40A of tube 40' is bonded into aperture 24 as described above. Following the bonding, intact part 40B of the tube is separated from slotted part 40A of the tube by cutting the tube transversely, flush with cylinder 23 as indicated by arrow D. Cylinder 23, and slotted part 40A of tube 40' therein are cut transversely along dotted lines E and F to form three separate assemblies 25A, 25B, and 25C, comprising cylinders 23A, 23B, and 23C respectively, each thereof including six segments 26 having gaps 28 therebetween. Cooling channels, through holes for bolts, and O-ring grooves may be added to the cylinders, if required.

It should be noted here, that while the present invention is described in terms of an assembly 20 including six diode laser bars located in a heat-sink 22 having an external form that is cylindrical, this should not be construed as limiting the invention. The inventive assembly may include more or less than six diode-laser bars and the heat-sink may have an external form other than cylindrical. Facilities for water-cooling heat-sink 22 may also be omitted if power consumed by the diode-lasers is sufficiently low. Those skilled in the art may practice these and other variations without departing from the spirit and scope of the present invention.

A particular advantage of the present invention is that there is no requirement to individually manufacture and assemble segments into a form suitable for holding diode-laser bars to form a cylindrical two-dimensional array of diode lasers. A dielectric tube such as tube 40 can be slotted according to the number of segments required while still leaving an intact end of the tube for holding the segments precisely in their required alignment while they are being bonded in the heat-sink. This can significantly reduce the cost of manufacturing the inventive diode-laser array assembly compared with the cost of manufacturing prior art assemblies.

In the description of the inventive cylindrical diode-laser array discussed above a preferred cooling method for the array is to place elements thereof in thermal communication with a water-cooled cylindrical heat-sink. While a water-cooled heat-sink is particularly effective in cooling the inventive array it may limit use of the array to use in locations where there is a suitable water supply. It is possible of course to provide a self-contained water (or other fluid) cooling system, this however would add to the cost and complexity of the array.

Figure 12:
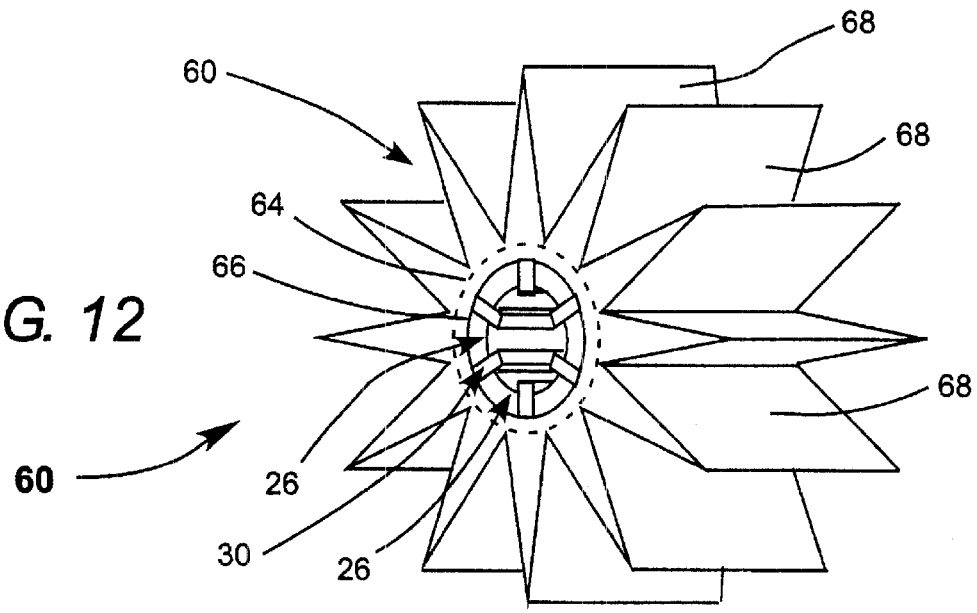
FIG. 12 schematically illustrates another embodiment of a cylindrical two-dimensional diode-laser array in accordance with the present invention, including an air-cooled metal heat-sink having a plurality of radially extending fins.

In FIG. 12 an embodiment 60 of the inventive two-dimensional cylindrical diode-laser array is illustrated in which a conductively cooled (air cooled) heat-sink 62 is provided. Heat-sink 62 includes a cylindrical portion indicated by dotted line 64. An aperture 66 extends through the cylindrical portion of the heat-sink. Bonded inside aperture 66 in thermal contact with heat-sink 62 is a plurality of dielectric segments 26 having diode laser bars 30 therebetween. Those aspects of array 60 relating to assembling the segments and diode laser bars within the heat-sink and making electrical contact with the diode laser bars, are not shown in FIG. 12 (and other illustrations following) to highlight the cooling aspects of the array.

Extending radially outward from cylindrical portion 64 of heat-sink 62 is a plurality of longitudinally-oriented cooling fins 68. Cooling fins 68, here, have a tapered section giving heat-sink 62 a somewhat stellated appearance. Those skilled in the art may use other sections for such longitudinally-oriented fins without departing from the spirit and scope of the present invention.

It is believed that the longitudinally-oriented cooling fins of heat-sink 62, in themselves, can provide a more rapid outward flow of heat from the cylindrical portion of the heat-sink than would diametrically-oriented fins, similar to those commonly used for cooling combustion cylinders of air-cooled internal combustion engines. Further, the longitudinally oriented fins are particularly suited to enhancement of their cooling effect by forced air movement over the fins.

Figure 13:
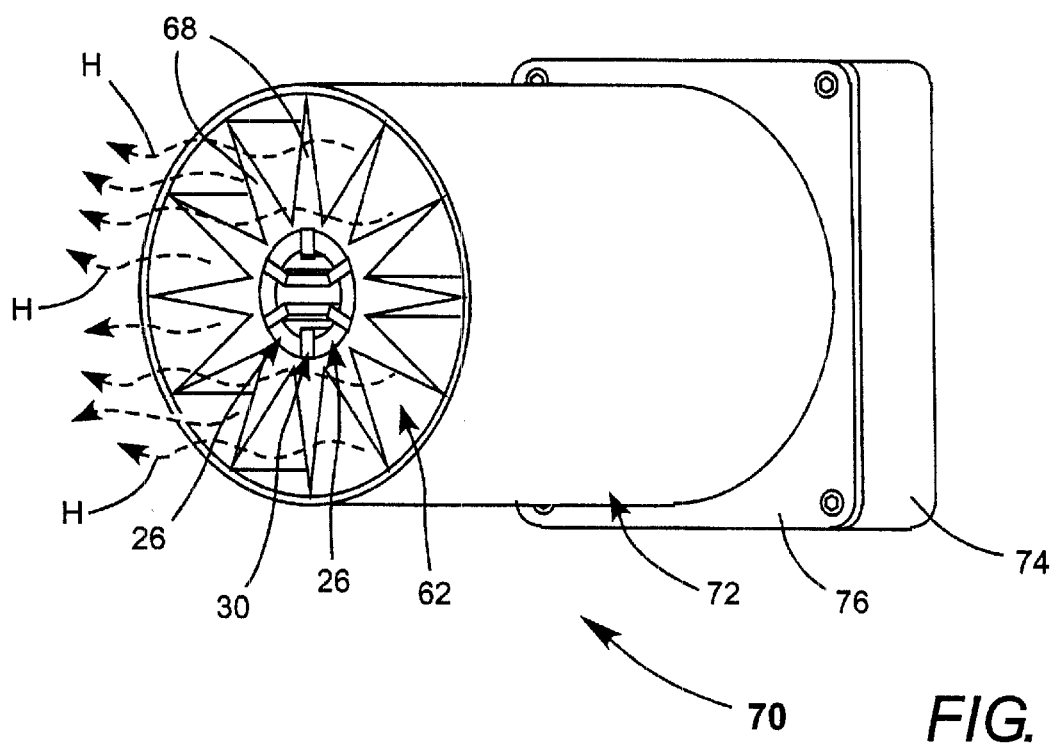
FIG. 13 schematically illustrates yet another embodiment of a cylindrical two-dimensional diode-laser array in accordance with the present invention similar to the laser array of FIG. 12, but wherein the radially-extending fins of the metal heat-sink are surrounded by a housing, and a fan is provided for blowing air through the housing and over the fins for improving air-cooling capacity.

Referring now to FIG. 13 another embodiment 70 of an air-cooled two-dimensional cylindrical diode-laser array in accordance with the present invention is illustrated. Array 70 includes a heat-sink 62 as described above with reference to array 60 of FIG. 12. In array 70, however, longitudinally-oriented fins 68 are surrounded by a straight sleeve 72. A fan 74 is attached to sleeve 72 via a flange 76. Fan 74 blows air through the sleeve and over fins 68 as indicated by dotted lines H. This improves the cooling effectiveness of the fins.

Figure 14A:
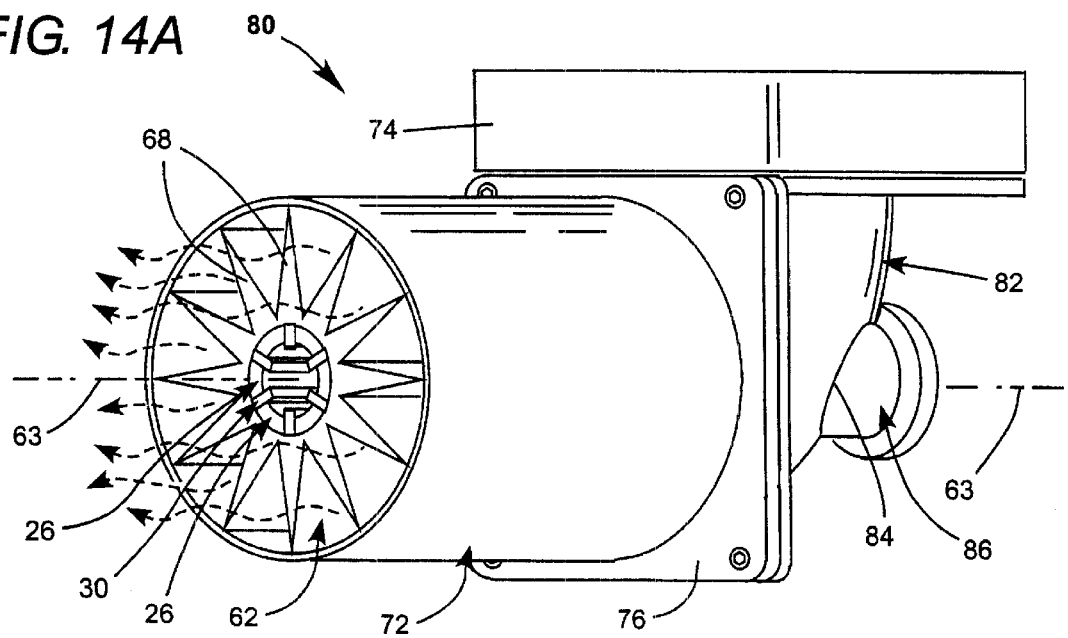
FIGS. 14A and 14B schematically illustrate still another embodiment of a cylindrical two-dimensional diode-laser array in accordance with the present invention similar to the laser array of FIG. 13, but wherein the fan is mounted on a 90-degree pipe-elbow to allow a passage through the cylindrical diode-laser array.
Figure 14B:
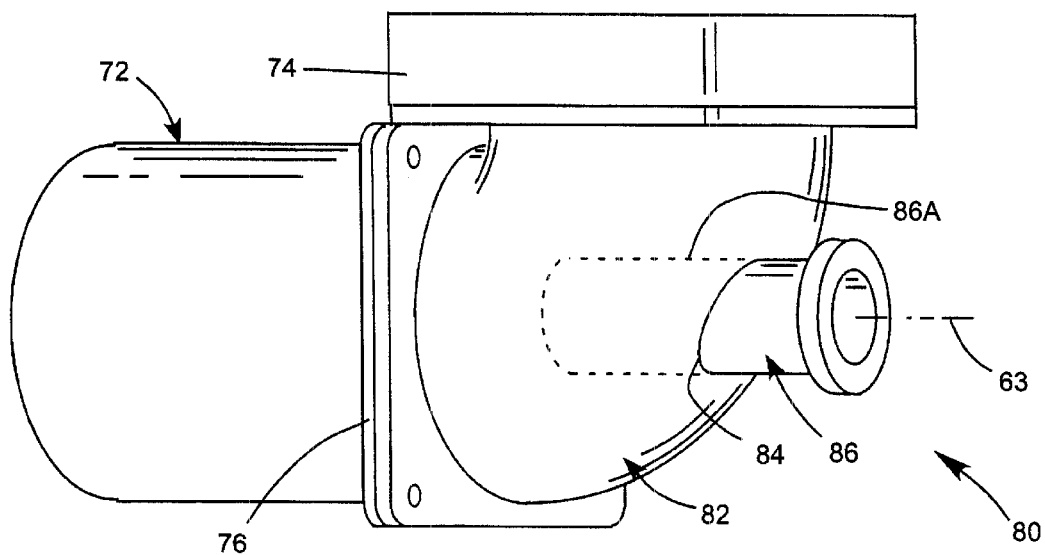

A disadvantage of array 70 is that the array is essentially "single-ended", as fan 74 effectively closes off one end of sleeve 72. Because of this, array 70 is not well suited for applications where an object must be passed through the array. One such application is continuous welding of plastic pipes. In FIGS. 14A and 14B, yet another embodiment 80 of an air-cooled two-dimensional cylindrical diode-laser array in accordance with the present invention is illustrated that is configured to overcome this disadvantage.

Array 80 includes a heat-sink 62 having fins 68 surrounded by a straight sleeve 72 as described above with reference to array 70 of FIG. 13. In array 80, however, fan 74 is arranged to blow air through sleeve 72 via a curved sleeve or pipe 82, preferably having about the same diameter as sleeve 72. Curved sleeve 82 is penetrated by an aperture 84 that allows a "view" through the array along a cylindrical axis 63 of heat-sink 62. Preferably a tube 86 is provided extending, coaxially with axis 63, through aperture 84 into curved sleeve 82 as indicated in FIG. 14B by dotted line 86A. Tube 86, thus arranged provides resistance to minimize the fraction of air blown by fan 74 that can escape through aperture 84.

The present invention is described and depicted with reference to a preferred and other embodiments. The invention, however, is not limited by the embodiments described and depicted. Rather, the invention is limited only by the claims appended hereto.

For example, the assembly approach described herein results in the surfaces of the dielectric insert being flush or coplanar with the planar faces of the heat sink. This allows multiple assemblies to be bolted together more easily. It is within the scope of the subject invention to alter the assembly method to omit the step of separating the exposed undivided or substantially intact portion 40B of the insert from the divided portion. This alternative would result in a structure closer in appearance to that shown in FIG. 7, although the exposed portion would preferably be made much smaller to begin with.

In another alterative, a portion or all of the undivided section of the insert could be mounted within the heat sink. In fact, if the axial length of the undivided section 40B was made relatively small, the entire insert could be loaded into the heat sink, obviating the need for separating the insert after the bonding.

What is claimed is:

1. Laser apparatus comprising:
    a metal heat-sink having a circular aperture extending therethrough defining a cylindrical inner wall of said heat-sink;
    a plurality of fractionally-cylindrical segments of an electrically insulating material bonded to said inner wall of said heat-sink, each of said segments having a metal layer on an inward-facing surface and longitudinal edges thereof, with said longitudinal edges of adjacent said segments facing each other and spaced apart defining a gap therebetween; and
    a plurality of diode-lasers disposed in each of said gaps.

2. The apparatus of claim 1, wherein said pluralities of lasers are each arranged in a longitudinal array in a diode-laser bar.

3. The apparatus of claim 1, wherein there are six segments.

4. The apparatus of claim 1, wherein said heat-sink is made of a metal selected from the group of metals consisting of copper, molybdenum, and aluminum.

5. The apparatus of claim 4, wherein said heat-sink is made of copper.

6. The apparatus of claim 1, wherein said electrically insulating material forming the fractionally-cylindrical segments is a dielectric material selected from the group of dielectric materials consisting of beryllia and alumina.

7. The apparatus of claim 6, wherein said dielectric material is beryllia.

8. The apparatus of claim 6, wherein said dielectric material is alumina.

9. The apparatus of claim 1, wherein each plurality of diode-lasers in each of said gaps is contained in a diode-laser bar.

10. The apparatus of claim 9, wherein said diode-laser bars are electrically connected in series via said metal layers on edges and surfaces of said segments.

11. The apparatus of claim 1, wherein said heat-sink is water-cooled.

12. The apparatus of claim 1, wherein said heat-sink is air-cooled.

13. The apparatus of claim 12, wherein said heat-sink has a circular portion through which said aperture extends and includes a plurality of longitudinally oriented fins extending radially outward from said circular section.

14. The apparatus of claim 13, wherein said fins are surrounded by a sleeve, and the apparatus further includes a fan arranged to move air through said sleeve and across said fins.

15. A diode-laser array made by the method comprising the following steps:
   (a) providing a metal heat-sink having a first length and a longitudinal axis, and having a circular aperture extending therethrough, said aperture defining a cylindrical inner wall of said heat-sink;
   (b) providing a cylindrical tube of a dielectric material, said tube having a wall, and having a second length greater than said first length;
   (c) cutting a plurality of longitudinal slots through a first portion of said tube wall, each of said first longitudinal slots having a third length about equal to or greater than said first length and less than said second length, said first longitudinal slots dividing said first portion of said tube wall into a plurality of fractionally cylindrical segments of said dielectric material and leaving a second portion of said tube substantially intact and attached to said plurality of fractionally cylindrical segments, each of said segments having an inner surface, an outer surface and longitudinal edges, said longitudinal edges of adjacent said segments facing each other and spaced apart defining a gap therebetween;
   (d) metallizing said inner surface and said longitudinal edges of each of said segments;
   (e) inserting said metallized segments in said circular aperture of said heat-sink with said intact portion of said tube still attached to said segments and outside of said circular aperture;
   (f) bonding said metallized segments to said inner wall of said heat-sink; and
   (g) following step (f) separating said substantially intact portion of said tube from said bonded segments.

16. A diode laser array made by the a method comprising the following steps:
   (a) providing a heat-sink having a circular aperture extending therethrough, said aperture defining a cylindrical inner wall of said heat-sink;
   (b) providing a cylindrical tube of a dielectric material, said tube having a wall;
   (c) forming a plurality of longitudinal slots along a portion of the axial length of the tube to divide the tube wall into a plurality of fractionally cylindrical segments of said dielectric material and leaving a second portion of said tube substantially intact and supporting said segments, each of said segments having an inner surface, an outer surface and longitudinal edges, said longitudinal edges of adjacent said segments facing each other and spaced apart defining a gap therebetween, with the length of each slot and the width of said each gap being configured to receive a laser diode bar therein;
   (d) metallizing said inner surface and said longitudinal edges of each of said segments;
   (e) inserting said metallized segments in said circular aperture of said heat-sink in a manner so that at least a portion of the substantially intact portion of the tube remains outside of said circular aperture;
   (f) bonding said metallized segments to said inner wall of said heat-sink; and
   (g) mounting a plurality of laser diode bars in said gaps.

* * * * *